United States Patent
Lee et al.

(10) Patent No.: US 12,222,224 B2
(45) Date of Patent: Feb. 11, 2025

(54) ELECTRONIC APPARATUS FOR CONTROLLING SENSOR AND OPERATION METHOD THEREOF

(71) Applicant: AGENCY FOR DEFENSE DEVELOPMENT, Daejeon (KR)

(72) Inventors: Chang Min Lee, Seoul (KR); Seong Lyun Kim, Seoul (KR)

(73) Assignee: AGENCY FOR DEFENSE DEVELOPMENT, Daejeon (KR)

( * ) Notice: Subject to any disclaimer, the term of this patent is extended or adjusted under 35 U.S.C. 154(b) by 617 days.

(21) Appl. No.: 17/406,540

(22) Filed: Aug. 19, 2021

(65) Prior Publication Data
US 2022/0187100 A1    Jun. 16, 2022

(30) Foreign Application Priority Data
Dec. 10, 2020    (KR) .................. 10-2020-0172533

(51) Int. Cl.
*G01D 18/00*    (2006.01)
*G01D 3/06*    (2006.01)
(Continued)

(52) U.S. Cl.
CPC ............. *G01D 3/063* (2013.01); *G01K 1/026* (2013.01); *G01V 1/308* (2013.01); *G01D 18/00* (2013.01);
(Continued)

(58) Field of Classification Search
CPC ........ G01D 3/063; G01D 21/00; G01D 18/00; G01K 1/026; G01K 2213/00; G01K 3/10;
(Continued)

(56) References Cited

U.S. PATENT DOCUMENTS

2007/0080288 A1    4/2007    Lim et al.
2012/0173186 A1    7/2012    Jung et al.
(Continued)

FOREIGN PATENT DOCUMENTS

KR    100683848 B1    2/2007
KR    20120076103 A    7/2012
(Continued)

OTHER PUBLICATIONS

Lou et al. ( A Data-Driven Adaptive Sampling Method Based on Edge Computing. Sensors 2020, 20, 2174. https://doi.org/10.3390/s20082174) (Year: 2020).*
(Continued)

*Primary Examiner* — Lisa M Caputo
*Assistant Examiner* — Christian T Bryant
(74) *Attorney, Agent, or Firm* — MILES & STOCKBRIDGE P.C.

(57) ABSTRACT

The disclosure generally relates to devices and techniques for operating an electronic apparatus that controls a sensor, the devices and techniques including acquiring first sensing data through the sensor, identifying a data variation based on the first sensing data and sensing data for a first time point and a second time point acquired in advance based on a sampling period of the sensor, identifying target data among a plurality of predetermined meaningful data based on the identified data variation and determining a time point at which the target data is to be acquired, and controlling the sampling period based on the determined time point.

9 Claims, 8 Drawing Sheets

(51) Int. Cl.

| | | |
|---|---|---|
| *G01D 21/00* | (2006.01) | |
| *G01K 1/02* | (2021.01) | |
| *G01K 3/10* | (2006.01) | |
| *G01V 1/30* | (2006.01) | |
| *H04W 4/38* | (2018.01) | |
| *H04W 84/18* | (2009.01) | |
| G05B 23/02 | (2006.01) | |
| H03M 1/12 | (2006.01) | |
| H04W 52/02 | (2009.01) | |

(52) U.S. Cl.
CPC ............ *G01D 21/00* (2013.01); *G01K 3/10* (2013.01); *G01K 2213/00* (2013.01); *G01V 2210/6122* (2013.01); *G05B 23/0221* (2013.01); *G05B 23/0264* (2013.01); *G05B 23/0294* (2013.01); *H03M 1/124* (2013.01); *H04W 4/38* (2018.02); *H04W 52/0261* (2013.01); *H04W 84/18* (2013.01)

(58) Field of Classification Search
CPC ........... G01V 1/308; G01V 2210/6122; H03M 1/124; G05B 23/0221; G05B 23/0264; G05B 23/0294; H04W 52/0261; H04W 84/18; H04W 4/38

See application file for complete search history.

(56) References Cited

U.S. PATENT DOCUMENTS

| | | | | |
|---|---|---|---|---|
| 2014/0247206 | A1* | 9/2014 | Grokop | G06F 1/3287 |
| | | | | 345/156 |
| 2017/0153610 | A1* | 6/2017 | Kuntagod | H04M 1/72412 |
| 2019/0033847 | A1* | 1/2019 | Cella | G05B 13/028 |
| 2020/0201292 | A1* | 6/2020 | Cella | G05B 23/0259 |

FOREIGN PATENT DOCUMENTS

| | | |
|---|---|---|
| KR | 20180012402 A | 2/2018 |
| KR | 20180112886 A | 10/2018 |

OTHER PUBLICATIONS

Srbinovski et al. (An Energy Aware Adaptive Sampling Algorithm for Energy Harvesting WSN with Energy Hungry Sensors. Sensors 2016, 16, 448. https://doi.org/10.3390/s16040448) (Year: 2016).*

Alippi et al. ("An Adaptive Sampling Algorithm for Effective Energy Management in Wireless Sensor Networks With Energy-Hungry Sensors," in IEEE Transactions on Instrumentation and Measurement, vol. 59, No. 2, pp. 335-344, Feb. 2010, doi: 10.1109/TIM.2009.2023818.) (Year: 2010).*

Scarabottolo et al. ( A spectrum-based adaptive sampling algorithm for smart sensing. 10.1109/UIC-ATC.2017.8397444 IEEE 3rd International Conference on Smart World Congress (SmartWorld 2017). Aug. 2017) (Year: 2017).*

Decision to Grant issued on Jun. 29, 2022 in counterpart Korean Application No. 10-2020-0172533.

* cited by examiner

```
Algorithm 1 : Adaptive sampling algorithm for monitoring (ASA-m)
Input : Sampling data($D_n$);
float $B_n, D_n$ = initial, $B'$ = const;
float $f_s^{n+1}$ = initial, $r_n = mod(D_n, B')$;
Output : Adaptive sampling frequency($f_s^{ASA-m}$)

Sensor node process :
While(1) {
    float $D_{n-1} = D_n$, $B_{n-1} = B_n$;
    float $r_{n-1} = r_n$, $V_c^{n-1} = V_c^n$, $f_s^n = f_s^{n+1}$;
    scanf("%f", &$D_n$);
    float $B_n = B' * round(D_n/B')$, $B_x = B' * div(D_n, B')$;
    float $r_n = mod(D_n, B')$;
    float $V_c^n = D_n' * f_s^n$, $V_c^{n+1} = V_c^n - (V_c^n - V_c^{n-1})$, $T_s^n = 1/f_s^n$;

if ($D_n > D_{n-1}$) {
        if ($|B_n - B_{n-1}| > B'$) {
            int $q_{over} = |B_n - B_{n-1}|/B'$;
            $f_s^{n+1} = q_{over} \times f_s^n$;
        }
        elseif ($|D_n - B_n| < \alpha B'$) {
            $f_S^{n+1} = |V_c^{n+1}|/B'$;
        }
        else {
            $f_S^{n+1} = |V_c^{n+1}|/(2B' - r_n)$;
            $T_s^{n+1} = 1/f_s^{n+1}$;
            $B_n = round(B_n + (V_s^{n+1} * T_s^{post}))$;
        }
    }
    else {
        if ($|B_n - B_{n-1}| > B'$) {
            int $q_{over} = |B_n - B_{n-1}|/B'$;
            $f_s^{n+1} = q_{over} \times f_s^n$;
        }
        elseif ($|D_n - B_n| < \alpha B'$) {
            $f_S^{n+1} = |V_c^{n+1}|/B'$;
        }
        else {
            $f_S^{n+1} = |V_c^{n+1}|/(B' + r_n)$;
            $T_s^{n+1} = 1/f_s^{n+1}$;
            $B_n = round(B_n + (V_s^{n+1} * T_s^{post}))$;
        }
    }
    if ($f_s^{n+1} < f_s^{max}$) {
        $f_s^{n+1} = f_s^{max}$;
    }
}

Server process : Estimate the $1^{st}$ sampling data after $T_s^{post}$
if ($\alpha B' < |D_n - B_n| < B'$) {
    $D_{pre} = (D_n + (V_c^{post} * T_s^{post}))$;
}
```

ELECTRONIC APPARATUS FOR CONTROLLING SENSOR AND OPERATION METHOD THEREOF

CROSS-REFERENCE TO RELATED APPLICATION(S)

This application claims the benefit of Korean Patent Application No. 10-2020-0172533, filed on Dec. 10, 2020, in the Korean Intellectual Property Office, the disclosure of which is incorporated herein by reference in its entirety.

BACKGROUND OF THE INVENTION

1. Field of the Invention

The present disclosure generally relates to an electronic apparatus for controlling a sensor based on a data variation and a method thereof.

2. Description of the Related Art

A sensor continuously consumes energy during data collection. For this reason, energy efficiency is important for a sensor placed in a location where energy supply is difficult, such as a sensor placed in a mountain for fire detection.

In this respect, energy harvesting technology has been applied to a sensor such that the sensor can generate energy by itself through photovoltaic power generation. In general, however, harvesting technology is vulnerable to a change in environment and thus, it is difficult to stably supply energy. As of yet, energy efficiency is still an issue.

To achieve energy efficiency, research is being conducted on a method of setting a data collection frequency in proportion to an amount of energy remaining in a sensor. For example, energy efficiency can be improved by increasing the data collection frequency when the amount of energy remaining in the sensor is relatively large and reducing the data collection frequency when the amount of energy remaining in the sensor is relatively small. However, in such cases, apart from the efficient use of energy, the quality of information required by a system, that is, a quality of service (QoS) may not be guaranteed. When the QoS is not guaranteed, data that should be collected may be missed. In this case, a system misoperation may be caused, which may lead to more severe issues.

Accordingly, the inventors have identified systems, methods, apparatuses, and non-transitory computer-readable mediums for controlling a sensor by comprehensively considering a quality of data collected in addition to energy efficiency of the sensor.

SUMMARY OF THE INVENTION

Accordingly, the present invention is directed to an electronic apparatus for controlling sensor and operation method thereof that substantially obviates one or more problems due to limitations and disadvantages of the related art.

An aspect provides an electronic apparatus for controlling a sensor to selectively collect required information based on a data variation of the sensor and an operation method of the electronic apparatus so that energy of the sensor is efficiently used while a quality of data collected by the sensor is guaranteed.

Technical goals of the present disclosure are not limited to the aforementioned technical features, and other unstated technical goals may be inferred from example embodiments described herein.

According to an aspect, there is provided an operation method of an electronic apparatus for controlling a sensor, the operation method including acquiring first sensing data through the sensor, identifying a data variation based on the first sensing data and sensing data for a first time point and a second time point acquired in advance based on a sampling period of the sensor, identifying target data among a plurality of predetermined meaningful data based on the identified data variation and determining a time point at which the target data is to be acquired, and controlling the sampling period based on the determined time point.

According to another aspect, there is also provided an electronic apparatus for controlling a sensor, the electronic apparatus including a data acquirer configured to acquire first sensing data through the sensor, a data analyzer configured to identify a data variation based on the first sensing data and sensing data for a first time point and a second time point acquired in advance based on a sampling period of the sensor, identify target data among a plurality of predetermined meaningful data based on the identified data variation, and determine a time point at which the target data is to be acquired, and a period controller configured to control the sampling period based on the determined time point.

According to still another aspect, there is also provided a non-transitory computer-readable recording medium including a computer program to execute an operation method of an electronic apparatus, the operation method including acquiring first sensing data through a sensor, identifying a data variation based on the first sensing data and sensing data for a first time point and a second time point acquired in advance based on a sampling period of the sensor, identifying target data among a plurality of predetermined meaningful data based on the identified data variation and determining a time point at which the target data is to be acquired, and controlling the sampling period based on the determined time point.

According to example embodiments, it is possible to provide an electronic apparatus for controlling a sensor to selectively collect required information based on a data variation of the sensor and an operation method of the electronic apparatus so that energy of the sensor is efficiently used while a quality of data collected by the sensor is guaranteed.

Further, according to example embodiments, an electronic apparatus for controlling a sensor and an operation method of the electronic apparatus may determine whether the sensor is to collect information at a subsequent point in time in comprehensive consideration of a data variation and an amount of energy remaining in the sensor, thereby effectively collecting data while minimizing energy consumption of the sensor.

Additional features and advantages of the invention will be set forth in the description which follows, and in part will be apparent from the description, or may be learned by practice of the invention. The aspects and other advantages of the invention will be realized and attained by the structure particularly pointed out in the written description and claims hereof as well as the appended drawings.

It is to be understood that both the foregoing general description and the following detailed description are examples and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the embodiments of the present invention, examples of which are illustrated in the accompanying drawings. Wherever possible, like reference numbers will be used for like elements.

Terms used in embodiments are selected, as much as possible, from general terms that are widely used at present while taking into consideration the functions obtained in accordance with the present disclosure, but these terms may be replaced by other terms based on intentions of those skilled in the art, customs, emergence of new technologies, or the like. Also, in a particular case, terms that are arbitrarily selected by the applicant of the present disclosure may be used. In this case, the meanings of these terms may be described in corresponding description parts of the disclosure. Accordingly, it should be noted that the terms used herein should be construed based on practical meanings thereof and the whole content of this specification, rather than being simply construed based on names of the terms.

In the entire specification, when an element is referred to as "comprising" or "including" another element, the element should not be understood as excluding other elements so long as there is no special conflicting description, and the element may include at least one other element.

Throughout the specification, the expression "at least one of A, B, and C" may include the following meanings: A alone; B alone; C alone; both A and B together; both A and C together; both B and C together; and all three of A, B, and C together.

The term "terminal" mentioned below may be implemented as a computer or a portable terminal capable of accessing a server or another terminal through a network. Here, the computer may include, for example, a laptop computer, a desktop computer, and a notebook equipped with a web browser. The portable terminal may be a wireless communication device ensuring a portability and a mobility, and include any type of handheld wireless communication device, for example, a tablet PC, a smartphone, a communication-based terminal such as international mobile telecommunication (IMT), code division multiple access (CDMA), W-code division multiple access (W-CDMA), and long term evolution (LTE).

Figure 1:
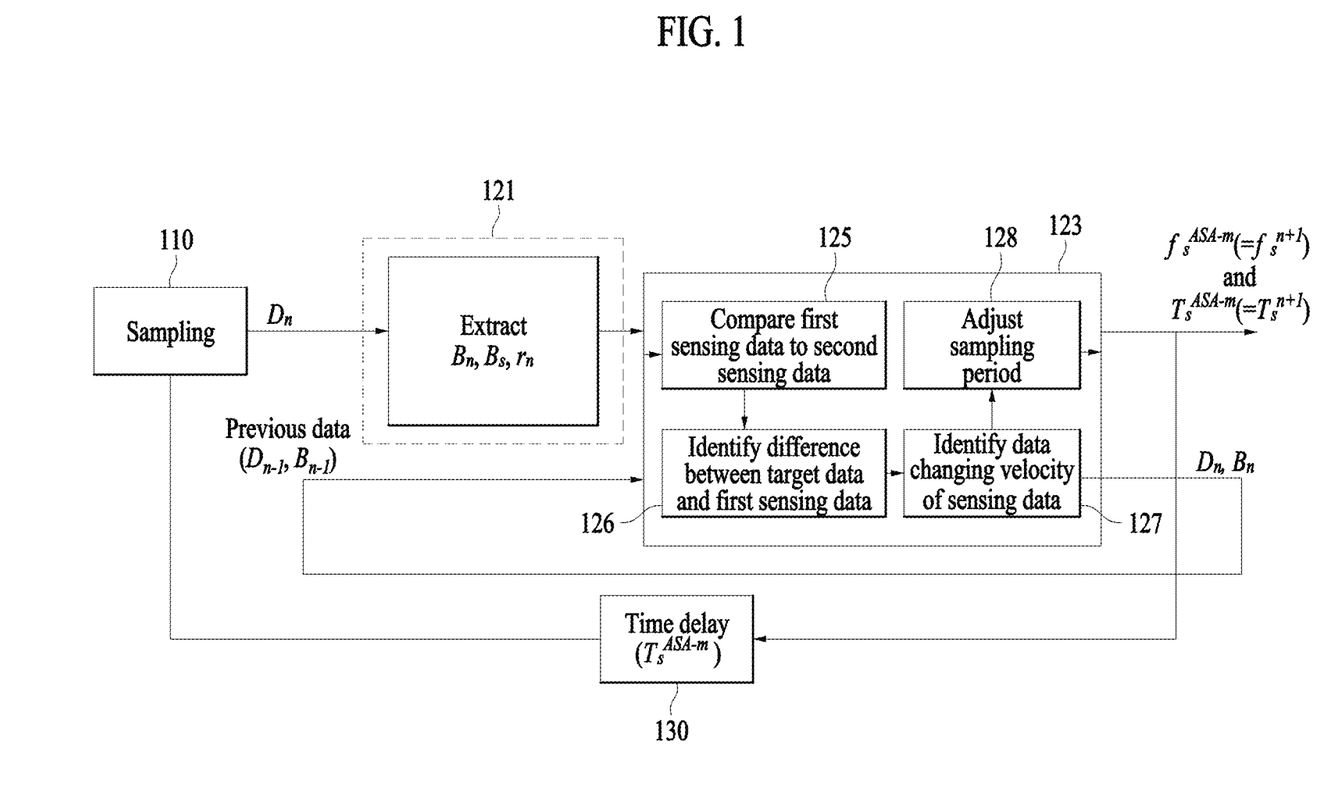
FIG. 1 is a diagram illustrating an operation method of an electronic apparatus for controlling a sensor according to an example embodiment.

FIG. 1 is a diagram illustrating an operation method of an electronic apparatus for controlling a sensor according to an example embodiment.

Referring to FIG. 1, data $D_n$ (hereinafter, referred to as "first sensing data") may be identified based on $n^{th}$ sampling being performed through a sensor in operation 110. The term "data" refers to data on a target to be sensed by a sensor. For example, when the sensor is a temperature sensor, the data may include a temperature value.

Based on the first sensing data being identified, meaningful data $B_n$ and $B_s$ related to the first sensing data and difference information $r_n$ may be identified in operation 121. A plurality of meaningful data may be designated in advance. Among the plurality of meaningful data, meaningful data related to the first sensing data may be identified. Meaningful data refers to information to be collected to satisfy a quality of service (QoS) defined according to a purpose of an application program that requires sensing data, based on the QoS.

For example, a plurality of meaningful data may be defined as a set of data in units of one degree Celsius (° C.). In this example, when the identified data is 23.2° C., $B_n$ of the meaningful data may be meaningful data closest to the collected data and correspond to 23° C. $B_s$ of the meaningful data may be meaningful data less than or equal to the collected data and correspond to 23° C.

In addition, based on the first sensing data being identified, information on a difference ($r_n$ or $B'-r_n$) between the first sensing data and $B_s$ may be identified. If $r_n$ is greater than $$\frac{B'}{2},$$

the difference may be $B'-r_n$. For example, when the identified data is 23.2° C. and $B_s$ is 23° C., difference data may correspond to 0.2° C. When the identified data is 22.7° C., the difference data may be 0.3° C.

In the example embodiment, data identified based on the $(n-1)^{th}$ sampling (hereinafter, referred to as "second sensing data"), meaningful data identified from the second sensing data, data identified based on $(n-2)^{th}$ sampling (hereinafter, referred to as "third sensing data"), and meaningful data identified from the third sensing data may be stored in advance. Depending on a case, the second sensing data may be referred to as sensing data for a first time point in a case in which an $(n-1)^{th}$ sampling time point is the first time point. Also, the third sensing data may be referred to as sensing data for a second time point in a case in which an $(n-2)^{th}$ sampling time point is the second time point.

In the example embodiment, information on the sensing data may be provided in a form of a map having an x axis representing a time in which the sensing data is acquired and a y axis representing a value of the sensing data (or a value of meaningful data). The map will be described in greater detail with reference to FIGS. 6 and 7.

In response to the meaningful data being identified in operation 121, a data variation may be identified based on the previously identified data (e.g., the second sensing data, the third sensing data, the meaningful data corresponding to the second sensing data, and the meaningful data corresponding to the third sensing data) as indicated by a box 123.

As an example, the first sensing data and the second sensing data may be compared in operation 125. For example, a difference in value between the first sensing data and the second sensing data may be identified. A difference between the first sensing data and target data actually targeted in relation to the first sensing data may be identified in operation 126. Based on the first sensing data, the second sensing data, and the third sensing data, a data changing velocity of sensing data may be identified in operation 127. Subsequently, for example, $(n+1)^{th}$ target data may be identified based on the identified data changing velocity. In addition, based on the identified data changing velocity, a sampling period ($f_s^{ASA-m}$, $T_s^{ASA-m}$) for acquiring the identified $(n+1)^{th}$ target data may be adjusted in operation 128. Based on the adjusted sampling period, a subsequent sampling time point may be controlled in operation 130.

More specifically, among the first sensing data and previous data, most recently identified data, for example, at least one of the second sensing data and the third sensing data may be used to identify a data changing velocity. For example, a first data changing velocity may be identified based on an acquisition time point of the first sensing data, an acquisition time point of the second sensing data, the first sensing data, and the second sensing data. Likewise, a second data changing velocity may be identified based on the acquisition time point of the second sensing data, an acquisition time point of the third sensing data, the second sensing data, and the third sensing data.

Target data corresponding to a change in data may be identified based on a data changing velocity. For example, when it is verified that the data changing velocity is in a data increasing trend, meaningful data greater by one than the meaningful data closest to the first sensing data may be identified as the target data. In this case, when the meaningful data closest to the first sensing data is 26° C., the target data may be 27° C. Also, when it is verified that the data changing velocity is in a data decreasing trend, meaningful data less by one than the meaningful data closest to the first sensing data may be identified as the target data. In this case, when the meaningful data closest to the first sensing data is 26° C., the target data may be 25° C.

A data changing velocity related to an acquisition of target data for the $(n+1)^{th}$ time may be identified based on the first data changing velocity and the second data changing velocity. A time point at which the target data is expected to be acquired may be identified based on the identified data changing velocity. Through this, a sampling period of the sensor may be controlled.

In the example embodiment, the sensor may be a temperature sensor for forest fire detection. The sensor accurately and efficiently checks a trend of temperature change in relation to forest fire detection. For example, in terms of determining the trend of temperature change, sensing data may be data in units of 1° C. In this example, the meaningful data may be set to be the data in units of 1° C. in advance. In example embodiments of the present disclosure, the electronic apparatus may identify a point in time in which target data is expected to be acquired by checking a trend of change in data based on a data variation of an environmental factor sensor related to a temperature having consecutive changes. The electronic apparatus may effectively and efficiently acquire meaningful data by controlling the sampling period based on the identified point in time.

Figure 2:
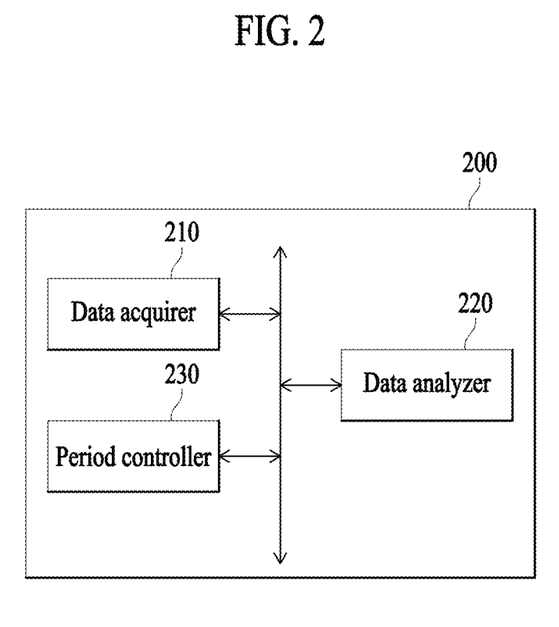
FIG. 2 is a functional block diagram of an electronic apparatus for controlling a sensor according to an example embodiment.

FIG. 2 is a functional block diagram of an electronic apparatus for controlling a sensor according to an example embodiment. FIG. 2 illustrates only components related to the present embodiment. However, it is apparent to those skilled in the art that other general-purpose components may be further included in addition to the components illustrated in FIG. 2.

An electronic apparatus 200 for controlling a sensor may include a data acquirer 210, a data analyzer 220, and a period controller 230. Each of the data acquirer 210, the data analyzer 220, and the period controller 230 may be a unit that processes at least one function or operation and may be implemented through hardware (e.g., a processor, a microprocessor, etc.), software, or a combination of hardware and software depending on embodiments.

In some cases, the electronic apparatus 200 may be implemented to include a memory and a processor therein. In such cases, the memory may include a variety of data associated with the electronic apparatus 200, for example, at least one instruction for operation of the electronic apparatus 200. Also, the processor may perform various operations related to the data acquirer 210, the data analyzer 220, and the period controller 230 based on the instruction stored in the memory.

The data acquirer 210 may acquire first sensing data through a sensor. The sensor may include, for example, a temperature sensor or a seismic sensor. However, it is merely an example, and the sensor may include various types of sensors related to an environmental factor measurement. The sensor may be wired or wirelessly connected to the electronic apparatus 200 to transmit and receive data to and from the electronic apparatus 200 but it is merely an example. In some cases, the sensor also may be implemented to be included in the electronic apparatus 200.

The first sensing data may include data on a current time point sensed through the sensor. For example, when the sensor includes the temperature sensor, the first sensing data may include data on a current temperature.

The data analyzer 220 may acquire sensing data based on a sampling period of the sensor. Based on the sampling period, the data analyzer 220 may acquire second sensing data at a first time point and acquire third sensing data at a second time point. As will be described later, because the sampling period may change, the sampling period corresponding to the first time point may be different from the sampling period corresponding to the second time point.

Meanwhile, the first time point may correspond to a time point at which sensing data is acquired immediately before the current time point at which the first sensing data is acquired. The second time point may correspond to a time point at which sensing data is acquired immediately before the second sensing data corresponding to the first time point is acquired. For example, when the current time point is a time point at which the sensor acquires data for the $n^{th}$ time, the first time point may be an $(n-1)^{th}$ data acquisition time point and the second time point may be an $(n-2)^{th}$ data acquisition time point.

The data analyzer 220 may identify a data variation based on the first sensing data and the sensing data (e.g., the second sensing data and the third sensing data) for the first time point and the second time point.

In the example embodiment, the data analyzer 220 may identify first meaningful data closest to the first sensing data among a plurality of predetermined meaningful data. Among the plurality of predetermined meaningful data, the data analyzer 220 may identify second meaningful data that is less than or equal to the first sensing data and closest to the first sensing data. The data analyzer 220 may identify a data variation using at least one of the first meaningful data, the second meaningful data, the sensing data for the first time point, and the sensing data for the second time point.

For example, the sensing data for the first time point may include the second sensing data acquired at the first time point and meaningful data closest to the second sensing data. The sensing data for the second time point may include the third sensing data acquired at the second time point and meaningful data closest to the third sensing data. The data variation may include a variation of a data changing velocity but is not limited thereto. The meaningful data may be a range of data to be acquired through the sensor and include data represented in units of, for example, 1° C. The plurality of meaningful data may refer to such data range.

In the example embodiment, the data analyzer 220 may identify a first data changing velocity based on the sensing data for each of the first time point and the second time point and identify a second data changing velocity based on the first sensing data and the sensing data for the second time point.

Specifically, the data analyzer 220 may identify a data changing velocity corresponding to the first sensing data based on a difference between the first sensing data and the second sensing data and the sampling period corresponding to the first sensing data. For example, the data analyzer 220 may identify a data changing velocity at a time point corresponding to the first sensing data, that is, an $n^{th}$ sensing time point based on Equation 1 below.

$$V_e^n = \frac{|D_n - D_{n-1}|}{T_S^n} = (|D_n - D_{n-1}|) f_S^n \quad \text{[Equation 1]}$$

In Equation 1, $V_c^n$ denotes a data changing velocity obtained at an $n^{th}$ time point, $D_n$ denotes the first sensing data, $D_{n-1}$ denotes the second sensing data, $T_S^n$ denotes a sampling time interval of the $n^{th}$ time point, and $f_S^n$ denotes a sampling period of the $n^{th}$ sensing time point.

A data changing velocity of an $(n-1)^{th}$ sensing time point may be identified in a manner corresponding to Equation 1. Through this, the data analyzer 220 may identify the data changing velocity of the $n^{th}$ sensing time point and the data changing velocity of the $(n-1)^{th}$ sensing time point.

In the example embodiment, the data analyzer 220 may identify a data changing velocity of an $(n+1)^{th}$ time point based on Equation 2 below.

$$V_c^{n+1} = V_c^n + \Delta V_c = V_c^n + (V_c^n - V_c^{n-1}) \quad \text{[Equation 2]}$$

In Equation 2, denotes a data changing velocity of the $(n+1)^{th}$ time point, denotes a variation of a data changing velocity, and denotes a data changing velocity of an $(n-1)^{th}$ time point.

In this example embodiment, the data analyzer 220 may identify target data based on a data variation. As an example, when the data variation is in an increasing trend, the data analyzer 220 may identify meaningful data greater by one than the meaningful data closest to the first sensing data to be target data. For example, when a plurality of meaningful data is 1, 2, 3, and 4, and when the meaningful data closest to the first sensing data is 2, the target data may be 3.

As another example, when the data variation is in a decreasing trend, the data analyzer 220 may identify meaningful data less by one than the meaningful data closest to the first sensing data to be target data. For example, when a plurality of meaningful data is 1, 2, 3, and 4, and when the meaningful data closest to the first sensing data is 2, the target data may be 1.

The data analyzer 220 may determine a time point at which the target data is expected to be acquired based on the identified data variation. In the example embodiment, the data analyzer 220 may determine the time point at which the target data is expected to be acquired, based on the first data changing velocity, the second data changing velocity, the target data, and the first sensing data. Specifically, the data analyzer 220 may determine a time point at which sensing data is to be acquired for the next time, for example, the $(n+1)^{th}$ time based on Equation 3 below. The time point at which sensing data is to be acquired for the $(n+1)^{th}$ time may correspond to the time point at which the target data is expected to be acquired.

$$T_s^{ASA-m} = \begin{cases} \dfrac{B'}{|B_n - B_{n-1}|} T_s^n, & \text{if } |B_n - B_{n-1}| > B' \\ \dfrac{B'}{|V_c^{n+1}|}, & \text{if } |D_n - D_n| < \alpha B' \\ \dfrac{2B' - r_n}{|V_c^{n+1}|}, & \text{otherwise} \end{cases} \quad \text{[Equation 2]}$$

In Equation 3, $T_s^{ASA-m}$ denotes an interval between an $n^{th}$ data acquisition time point and an $(n+1)^{th}$ data acquisition time point, and B' denotes a resolution of information collection for satisfying a QoS required by an application program and may be a variable value or a value set at intervals of a meaningful data value. For example, when an application program requiring information to be collected requires data collection of resolution of 1° C., B' may be set to be 1° C. Also, when the resolution is required to be changed in a predetermined period, B' may be variably set. The resolution indicates a fine degree of difference between collected information when collecting the information. Since it is obvious to those skilled in the art, descriptions of such are omitted for brevity. $T_s^n$ denotes a time interval between an $(n-1)^{th}$ data acquisition time point and the $n^{th}$ data acquisition time point. $\alpha$ denotes a sensitivity tuner of an algorithm corresponding to Equation 3.

In the example embodiment, the data analyzer 220 may determine a time point at which sensing data is to be acquired subsequently, that is, for the $(n+1)^{th}$ time based on Equation 4 below.

$$f_s^{ASA-m} = \begin{cases} \dfrac{|B_n - B_{n-1}|}{B'} f_s^n, & \text{if } |B_n - B_{n-1}| > B' \\ \dfrac{\frac{2|D_n - D_{n-1}|}{B'} f_s^n - \frac{|D_{n-1} - D_{n-2}|}{B'} f_s^{n-1}}{}, & \text{if } |D_n - D_n| < \alpha B' \\ \dfrac{\frac{2|D_n - D_{n-1}|}{2B' - r_n} f_s^n - \frac{|D_{n-1} - D_{n-2}|}{2B' - r_n} f_s^{n-1}}{}, & \text{otherwise} \end{cases} \quad \text{[Equation 4]}$$

In Equation 4, $f_s^{ASA-m}$ denotes a period corresponding to an $(n+1)^{th}$ data collection among data collection periods of a sensor used by the electronic apparatus according to the present example embodiment. $f_s^n$ denotes a period corresponding to an $n^{th}$ data collection and denotes a period corresponding to an $(n-1)^{th}$ data collection.

In the example embodiment, the period controller 230 may determine a time point at which the target data is expected to be acquired based on the identified data variation and control a sampling period based on the determined time point. For example, the period controller 230 may identify a time interval or period remaining to subsequent sensing for acquiring target data based on the first sensing data through the third sensing data. The period controller 230 may control the sampling period of the sensor based on the identified time interval or period.

The electronic apparatus 200 may control a period of the sensor based on identification of an amount of energy remaining in the sensor. In the example embodiment, the data analyzer 220 may verify whether the data variation corresponds to a linear change. When the data variation corresponds to the linear change, the period controller 230 may omit a sampling operation of the sensor at the determined time point.

A case in which the data variation is linear may indicate that an accuracy of data prediction is high. Thus, from this, it is understood that the prediction accuracy for data identified to be sensed at a subsequent time point is high. Accordingly, the period controller 230 may omit the sensing at a subsequent, that is, $(n+1)^{th}$ time point and use predicted data as the sensing data at the subsequent time point.

For example, when a data changing velocity of the $(n-2)^{th}$ and $(n-1)^{th}$ sensing time points corresponds to a data changing velocity of the $(n-1)^{th}$ and $n^{th}$ sensing time points, the data variation may be linear. In this example, it is estimated that the data changing velocity to be acquired for the $(n+1)^{th}$ time corresponds to the previous time, for example, $(n-1)^{th}$ or $n^{th}$ time point. Through this, the data analyzer 220 may estimate the sensing data to be acquired for the $(n+1)^{th}$ time and omit an actual sensing operation at the $(n+1)^{th}$ sensing time point. In this case, the data analyzer 220 may apply the estimated sensing data to be the sensing data of the $(n+1)^{th}$ sensing time point. As such, when an operation of the sensor is omitted, the number of operations of the sensor may be reduced, thereby achieving energy efficiency.

In the example embodiment, the data analyzer 220 may identify an amount of energy remaining in the sensor. When the identified amount of remaining energy is less than or equal to a predetermined value, the data analyzer 220 may identify energy consumption of the sensor and an amount of energy generated by the sensor. The energy consumption of the sensor refers to an amount of energy consumed in relation to an operation of the sensor and may include, for example, an amount of energy consumed by the sensor when acquiring the sensing data and an amount of energy consumed by the sensor for energy harvesting. The amount of energy generated by the sensor may include an amount of energy generated by the sensor based on the energy harvesting.

In this case, the data analyzer 220 may control the sampling period based on the energy consumption and the amount of energy generated. The data analyzer 220 may determine a period control factor based on the energy consumption and the amount of energy generated and modify the sampling period determined according to the data variation based on the determined period control factor. When the period control factor is 3, the sampling may be performed once at intervals of three periods, instead of performing the sampling at intervals of the sampling period determined based on the data variation. As an example, the sampling may be performed in units of three periods, for example, at the $n^{th}$ time point, an $(n+3)^{th}$ time point, and an $(n+6)^{th}$ time point.

Specifically, for example, the data analyzer 220 may control the sampling period based on Equation 5 below.

$$f_s^{RASA} = \frac{f_s^{ASA-m}}{N}, E[E_h] > E_c \quad \text{[Equation 5]}$$

In Equation 5, $f_s^{RASA}$ denotes a final sampling period controlled based on the amount of energy remaining in the sensor. N denotes a period control factor, which serves to extend an operational period such that the energy consumption is less than an average amount of energy to be acquired through the harvesting. $E[E_h]$ denotes an average amount of energy harvested by the sensor and $E_c$ denotes an amount of energy consumed by the sensor. Meanwhile, the period control factor may be determined according to Equation 6 below.

$$N > \frac{(P_w - P_{sl})T_w + P_{ss}T_{ss} + P_p(l)T_p + P_{tx}T_{tx}}{(E[P_h] - P_{sl})T_s^{ASA-m}} \quad \text{[Equation 6]}$$

In Equation 6, $P_w$ denotes power required by the sensor in operation, that is, when in an awake state. $P_{sl}$ denotes power required by the sensor in an idle state, that is, in a sleep state. $T_w$ denotes a time in which the sensor is awake. $P_{ss}$ denotes power required by the sensor to collect information. $T_{ss}$ denotes a period of time used for the sensor to collect information. $P_p(l)$ denotes power required to process based on a calculation load 1 of the sensor. $T_p$ denotes a period of time used for the processing. $P_{tx}$ denotes power required for data transmission. $T_{tx}$ denotes a time taken for data transmission.

Figure 3:
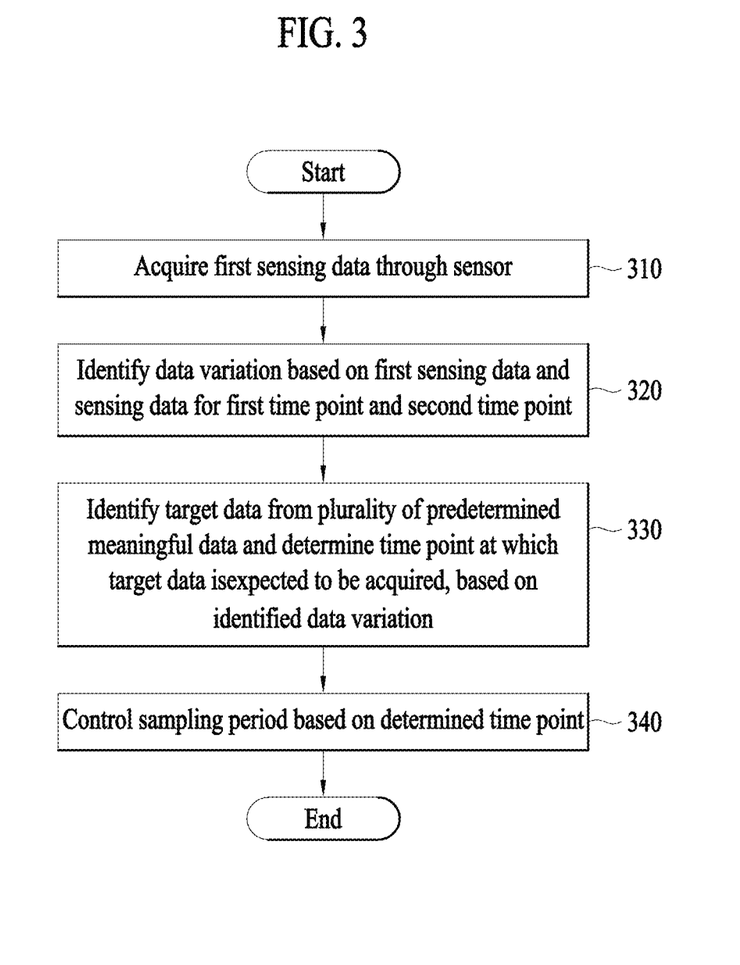
FIG. 3 is a flowchart illustrating operations of an operation method of an electronic apparatus for controlling a sensor according to an example embodiment.

FIG. 3 is a flowchart illustrating operations of an operation method of an electronic apparatus for controlling a sensor according to an example embodiment. Operations of the method illustrated in FIG. 3 may be performed in a different order from that illustrated in the drawings depending on the case.

Referring to FIG. 3, in operation 310, an electronic apparatus may acquire first sensing data through a sensor. For example, when the sensor is a temperature sensor, the electronic apparatus may acquire first sensing data related to a temperature through the sensor.

In operation 320, the electronic apparatus may identify a data variation based on the first sensing data and sensing data for a first time point and a second time point. Specifically, the first time point is a sensing time point immediately before the first sensing data is acquired. Also, the second time point may correspond to a sensing time point previous to the first time point. The sensing data for the first time point and the second time point may be previously acquired and stored in the electronic apparatus. When the first sensing data is acquired, the electronic apparatus may identify a data variation based on the sensing data for the second time point, the sensing data for the first time point, and the first sensing data.

For example, the electronic apparatus may identify a data changing velocity corresponding to an interval from the first time point to the present (hereinafter, referred to as a "first interval") and a data changing velocity corresponding to an interval from the second time point to the first time point (hereinafter, referred to as a "second interval"). The electronic apparatus may identify a variation of the data changing velocity based on the data changing velocity of each of the first interval and the second interval.

In operation 330, based on the identified data variation, the electronic apparatus may identify target data from a plurality of predetermined meaningful data and determine a time point at which the target data is expected to be acquired. For example, the electronic apparatus may determine meaningful data that is greater or less by one than the meaningful data corresponding to the first sensing data, to be the target data based on the data changing velocity. The electronic apparatus may identify a time point at which the target data is expected to be acquired based on the variation of the data changing velocity.

In operation 340, the electronic apparatus may control a sampling period based on the determined time point. The electronic apparatus may change the sampling period such that the sampling is performed at the determined time point.

Figure 4:
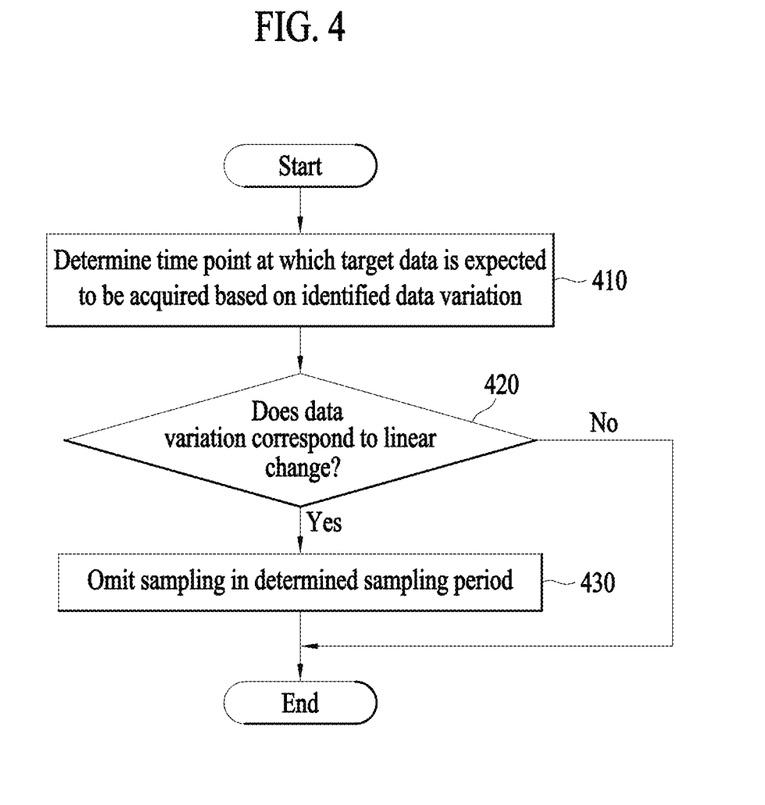
FIGS. 4 and 5 are flowcharts illustrating examples of an operation method of an electronic apparatus for controlling a sensor according to an example embodiment.
Figure 5:
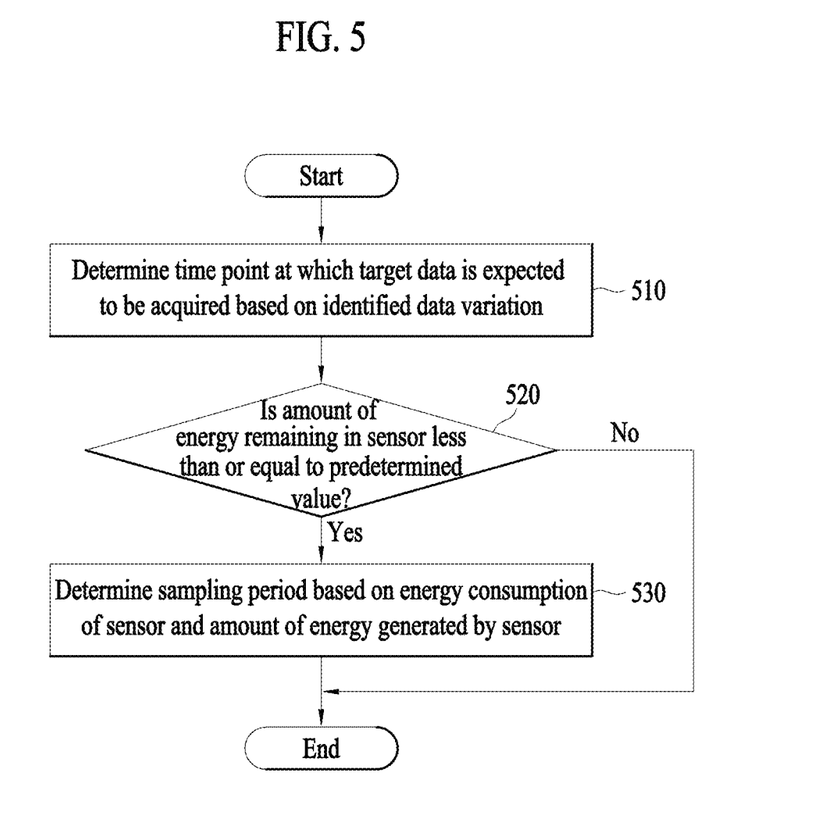

FIGS. 4 and 5 are flowcharts illustrating examples of an operation method of an electronic apparatus for controlling a sensor according to an example embodiment. Specifically, FIGS. 4 and 5 show a case in which a data variation or an amount of energy remaining in a sensor is considered in relation to operation 330 of FIG. 3.

FIG. 4 shows a case in which a data variation is additionally considered in relation to operation 330. Since operation 410 of FIG. 4 corresponds to operation 330 of FIG. 3, descriptions of such are omitted for brevity.

In operation 420, an electronic apparatus may verify whether a data variation corresponds to a linear change. When the data variation corresponds to the linear change, the electronic apparatus may perform operation 430. When the data variation does not correspond to the linear change, the electronic apparatus may terminate an operation of FIG. 4. In this case, operation 340 of FIG. 3 may be performed.

When the data variation is linear, in operation 430, the electronic apparatus may omit sampling in a sampling period determined in operation 410. When the data variation is linear, data to be acquired in a subsequent sampling period may be more accurately predicted. Thus, by omitting a sampling operation in the subsequent sampling period, energy efficiency of the sensor is achieved.

For example, the subsequent sampling period may be a period corresponding to a point in time at which target data is expected to be acquired. In this example, when the data variation is linear, it is assumed that the target data is acquired by omitting the sampling in the subsequent sampling period.

As such, when it is assumed that the target data is to be acquired at a subsequent sensing time point based on the case in which the data variation is linear, the electronic apparatus may provide information of such so as to quickly prepare for a dangerous situation indicated by the target data.

FIG. 5 shows a case in which an amount of energy remaining in a sensor is additionally considered in relation to operation 330. Since operation 510 of FIG. 5 corresponds to operation 330 of FIG. 3, descriptions of such are omitted for brevity.

In operation 520, an electronic apparatus may verify whether an amount of energy remaining in a sensor is less than or equal to a predetermined value. When the amount of energy remaining in the sensor is less than or equal to the predetermined value, the electronic apparatus may perform operation 530. When the amount of energy remaining in the sensor is greater than the predetermined value, the electronic apparatus may terminate an operation of FIG. 5. In this case, operation 340 of FIG. 3 may be performed.

When the amount of energy remaining in the sensor is less than or equal to the predetermined value, in operation 530, the electronic apparatus may determine a sampling period based on energy consumption of the sensor and an amount of energy generated by the sensor. When the amount of energy remaining in the sensor is less than or equal to the predetermined value, the electronic apparatus may identify a period control factor. The electronic apparatus may control the determined sampling period based on the period control factor. Since the related explanation has been made with reference to FIG. 2, descriptions of such are omitted for brevity.

Figure 6:
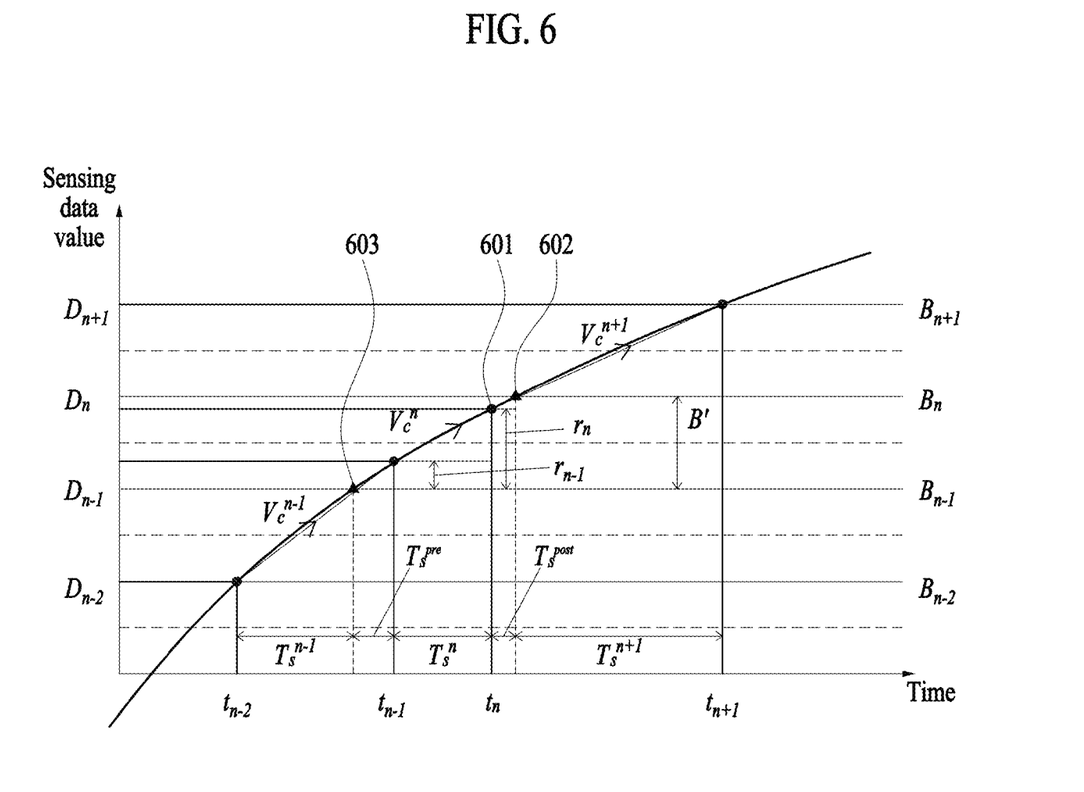
FIG. 6 is a diagram illustrating a method of determining a data collection period in an electronic apparatus for controlling a sensor according to an example embodiment.

FIG. 6 is a diagram illustrating a method of determining a data collection period in an electronic apparatus for controlling a sensor according to an example embodiment. Specifically, FIG. 6 is a diagram for describing information used to determine a sampling period of a sensor.

Referring to FIG. 6, first sensing data $D_n$ may be identified at a current time point tn. As illustrated in FIG. 6, the current time point may be understood as an $n^{th}$ time point.

In FIG. 6, $B_{n-2}$ through $B_{n+1}$ may denote a plurality of meaningful data determined in advance. For example, a sensor may be a temperature sensor and the plurality of meaningful data may be data at intervals of 1° C. In this example, $B_{n-2}$ through $B_{n+1}$ may be 25° C., 26° C., 27° C., and 28° C. In addition, meaningful data closest to the first sensing data may be $B_n$ (hereinafter, referred to as "first meaningful data") and meaningful data less than or equal to the first sensing data may be $B_{n-1}$ (hereinafter, referred to as "second meaningful data"). B' denotes a meaningful data unit or a unit of meaningful data variation. For example, when meaningful data corresponds to 25° C., 26° C., 27° C., and 28° C., B' may be 1° C.

In FIG. 6, $r_n$ is a difference (or error) between the first sensing data acquired at the $n^{th}$ time point and the meaningful data less than or equal to the first sensing data. In addition, $r_{n-1}$ is a difference between second sensing data acquired at an $(n-1)^{th}$ time point and meaningful data less than or equal to the second sensing data. Meanwhile, although FIG. 6 shows a case in which the meaningful data less than or equal to the first sensing data is the same as the meaningful data less than or equal to the second sensing data as an example, the present example is not to be taken as being limited thereto.

$V_c^{n-1}$ denotes a velocity of change between a second sensing data value and a third sensing data value acquired at an $(n-2)^{th}$ time point, $V_c^n$ denotes a velocity of change between the second sensing data value and a first sensing data value, and $V_c^{n+1}$ denotes an estimated velocity of change between the first sensing data value and a sensing data value to be acquired at an $(n+1)^{th}$ time point.

$T_s^{post}$ denotes a difference between a current time point and a time point at which first meaningful data is expected to be acquired. Since a sampling period may be calculated based on the first meaningful data, $T_s^{post}$ may be considered for a more accurate calculation of the sampling period.

Although not shown, in some cases, a grid pattern map may be initially formed based on a vertical line representing a time unit and a horizontal line representing a sensing data value unit. The electronic apparatus may display data acquired through a sensor on the grid pattern map, thereby visually providing information on a data period in a form of a graph. For example, in a case as shown in FIG. 6, a graph representing the first sensing data at a first position 601 on the map, representing the first meaningful data at a second position 602, and representing the second meaningful data at a third position may be provided. However, it is merely an example, and displaying at least some of the first sensing data, the first meaningful data, and the second meaningful data may be omitted. An example of the graph is described in greater detail with reference to FIG. 7.

Figure 7:
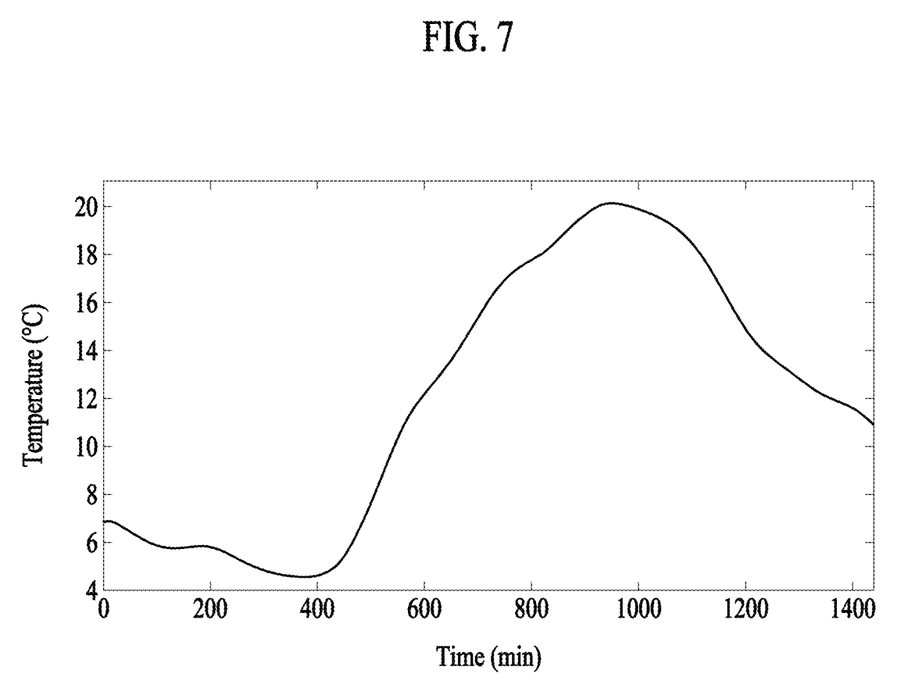
FIG. 7 illustrates an example of information on sensing data generated by an electronic apparatus according to an example embodiment.

FIG. 7 illustrates an example of information on sensing data generated by an electronic apparatus according to an example embodiment.

Specifically, FIG. 7 illustrates an example of a graph generated in response to displaying sensing data identified each time point on a basic map as shown in FIG. 6 when a sensor is a temperature sensor. In the graph of FIG. 7, a horizontal axis represents a time and a vertical axis represents a temperature value corresponding to a sensing data value.

In some cases, an electronic apparatus may provide a graph like the graph of FIG. 7 in real time. In such cases, a shape of the graph may be updated in real time.

Figure 8:
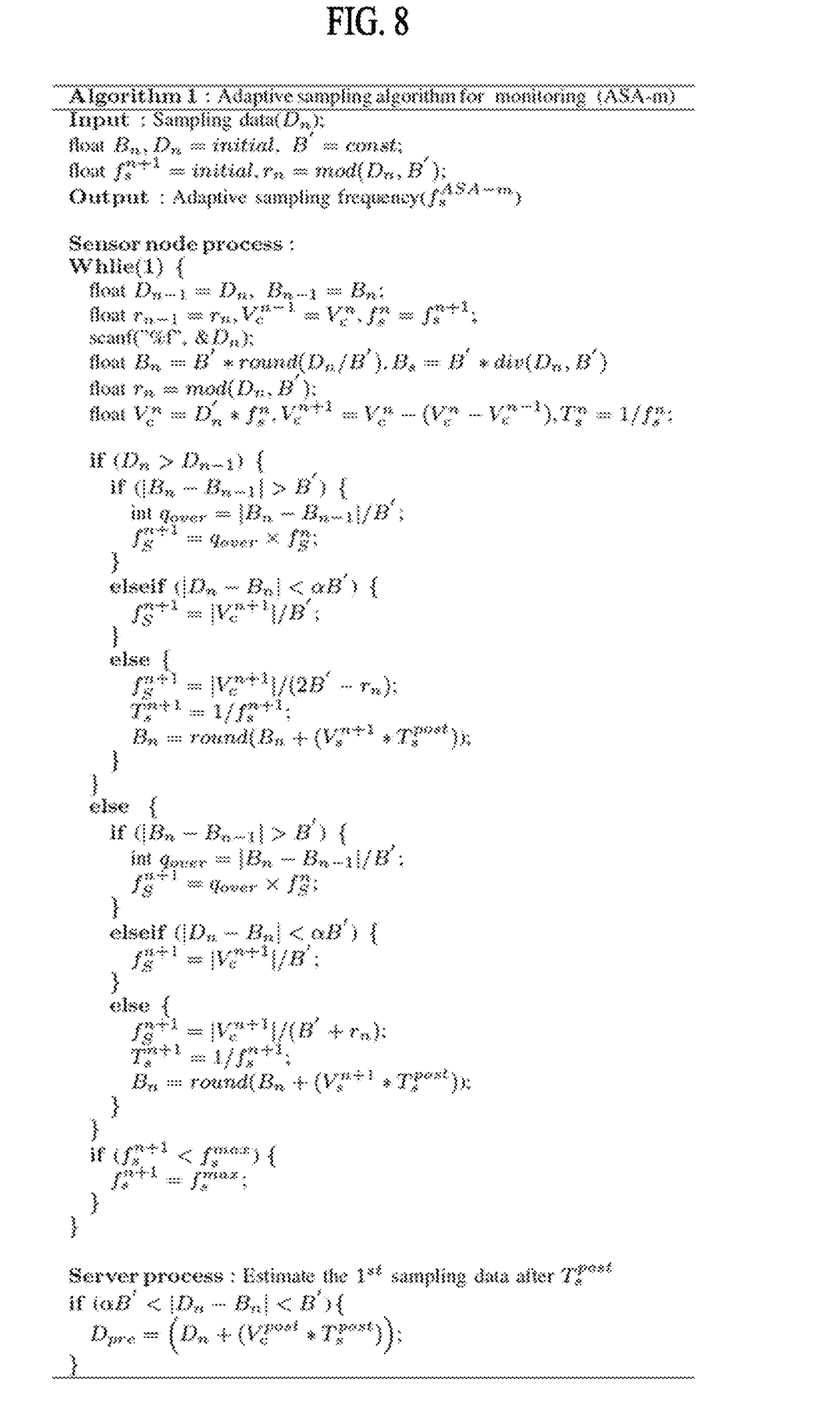
FIG. 8 illustrates an example of an algorithm used in an electronic apparatus for controlling a sensor according to an example embodiment.

FIG. 8 illustrates an example of an algorithm used in an electronic apparatus for controlling a sensor according to an example embodiment.

An information collection period of a sensor may be controlled based on an algorithm of FIG. 8. Information on factors included in the algorithm has been described above, so detailed content will be omitted.

The electronic apparatus described herein may include a permanent storage such as a disk drive, a communication port for handling communications with external devices, and user interface devices such as a touch panel, a key, and a button. The methods that are implemented as software modules or algorithms may be stored as program instructions or computer-readable codes executable by the processor on a computer-readable recording medium. Here, examples of the computer-readable recording medium include magnetic storage media (e.g., read only memory (ROM), random access memory (RAM), floppy disk, or hard disk), optically readable media (e.g., compact disk-read only memory (CD-ROM) or digital versatile disk (DVD)), etc. The computer-readable recording medium may be distributed over network coupled computer systems, and thus, the computer-readable code may be stored and executed in a distributed fashion. This medium may be read by the computer, stored in the memory, and executed by the processor.

The present embodiments may be described in terms of functional block components and various processing steps. Such functional blocks may be realized by any number of hardware and/or software components configured to perform specified functions. For example, embodiments may employ various integrated circuit (IC) components, e.g., memory elements, processing elements, logic elements, look-up tables, and the like, which may carry out a variety of functions under the control of one or more microprocessors or other control devices. Similarly, where the elements are implemented using software programming or software elements, the present embodiments may be implemented with any programming or scripting language such as C, C++, Java, assembler language, or the like, with the various algorithms being implemented with any combination of data structures, objects, processes, routines or other programming elements. Functional aspects may be implemented in algorithms that are executed on one or more processors. Furthermore, the embodiments described herein could employ any number of conventional techniques for electronics configuration, signal processing and/or control, data processing and the like. The terms "mechanism," "element," "means," and "configuration" are used broadly and are not limited to mechanical or physical embodiments. These terms may include meaning of a series of routines of software in association with a processor, for example.

It will be apparent to those skilled in the art that various modifications and variations can be made in the an electronic apparatus for controlling sensor and operation method thereof of the present invention without departing from the spirit or scope of the invention. Thus, it is intended that the present invention cover the modifications and variations of this invention provided they come within the scope of the appended claims and their equivalents.

What is claimed is:

1. A computer-implemented method for controlling a sensor, the method comprising:
    acquiring first sensing data through the sensor;
    identifying a data variation based on the first sensing data and sensing data for a first time point and a second time point acquired in advance based on a sampling period of a sampling operation of the sensor;
    identifying target data among a plurality of predetermined data based on the identified data variation and determining a time point at which the target data is to be acquired; and
    controlling the sampling period based on the determined time point;
    wherein the identifying the data variation includes:
    identifying, among the plurality of predetermined data, first data that is closest to the first sensing data and second data that is less than or equal to the first sensing data and closest to the first sensing data and identifying a difference between the target data and the first sensing data; and
    identifying the data variation using at least one of the identified difference, the first data, the second data, the sensing data for the first time point, and the sensing data for the second time point.

2. The method of claim 1, wherein the target data is determined among the plurality of data based on the data variation and the first data.

3. The method of claim 1, wherein the identifying of the data variation includes
    identifying a first data changing velocity based on the sensing data for each of the first time point and the second time point and identifying a second data changing velocity based on the sensing data for the second time point and the first sensing data, and
    the determining of the time point includes determining a time point at which the target data is to be acquired based on the first data changing velocity, the second data changing velocity, the target data, and the first sensing data.

4. The method of claim 1, further comprising:
    verifying whether the data variation corresponds to a linear change; and
    omitting, when the data variation corresponds to the linear change, a sampling operation of the sensor at the determined time point.

5. The method of claim 1, further comprising:
    identifying an amount of energy remaining in the sensor;
    identifying, when the identified amount of energy remaining in the sensor is less than or equal to a predetermined value, energy consumption of the sensor and an amount of energy generated by the sensor; and
    controlling the sampling period based on the energy consumption and the amount of energy generated by the sensor.

6. The method of claim 1, wherein the first time point and the second time point include sequential sampling time points before the first sensing data is acquired.

7. The method of claim 1, wherein the sensor includes a temperature sensor or a seismic sensor.

8. An electronic apparatus for controlling a sensor, the electronic apparatus comprising:
    a data acquirer configured to acquire first sensing data through the sensor;

a data analyzer configured to identify a data variation based on the first sensing data and sensing data for a first time point and a second time point acquired in advance based on a sampling period of a sampling operation of the sensor, identify target data among a plurality of predetermined data based on the identified data variation, and determine a time point at which the target data is to be acquired; and a period controller configured to control the sampling period based on the determined time point;

wherein the data analyzer configured to identify the data variation is configured to:

identify, among the plurality of predetermined data, first data that is closest to the first sensing data and second data that is less than or equal to the first sensing data and closest to the first sensing data and identify a difference between the target data and the first sensing data; and identify the data variation using at least one of the identified difference, the first data, the second data, the sensing data for the first time point, and the sensing data for the second time point.

9. A non-transitory computer readable medium having instructions stored thereon that, when executed by a processor, cause the processor to control a sensor by performing the operations comprising:

acquiring first sensing data through a sensor;

identifying a data variation based on the first sensing data and sensing data for a first time point and a second time point acquired in advance based on a sampling period of a sampling operation of the sensor;

identifying target data among a plurality of predetermined data based on the identified data variation and determining a time point at which the target data is to be acquired; and controlling the sampling period based on the determined time point;

wherein the identifying the data variation includes:

identifying, among the plurality of predetermined data, first data that is closest to the first sensing data and second data that is less than or equal to the first sensing data and closest to the first sensing data and identifying a difference between the target data and the first sensing data; and identifying the data variation using at least one of the identified difference, the first data, the second data, the sensing data for the first time point, and the sensing data for the second time point.

* * * * *